US006529075B2

United States Patent
Bruck et al.

(10) Patent No.: US 6,529,075 B2
(45) Date of Patent: Mar. 4, 2003

(54) AMPLIFIER WITH SUPPRESSION OF HARMONICS

(75) Inventors: Yuri Bruck, Carmiel (IL); Gennady Burdo, Haifa (IL); Michael Zelikson, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/925,969

(22) Filed: Aug. 10, 2001

(65) Prior Publication Data

US 2002/0041212 A1 Apr. 11, 2002

Related U.S. Application Data

(60) Provisional application No. 60/224,622, filed on Aug. 11, 2000.

(51) Int. Cl.[7] .............................................. H03F 3/45
(52) U.S. Cl. ..................... 330/252; 330/251; 330/253; 330/254; 330/260; 330/261; 330/258
(58) Field of Search ................................. 330/252, 303, 330/253, 254, 261, 260, 258, 149

(56) References Cited

U.S. PATENT DOCUMENTS

| | | | |
|---|---|---|---|
| 4,267,516 A | | 5/1981 | Traa |
| 4,287,478 A | | 9/1981 | Berger |
| 4,390,848 A | | 6/1983 | Blauschild |
| 4,794,342 A | * | 12/1988 | Kimura ...................... 330/252 |
| 5,081,423 A | * | 1/1992 | Koyama et al. ............. 330/252 |
| 5,126,586 A | | 6/1992 | Gilbert |
| 5,343,163 A | * | 8/1994 | Linder et al. ................ 330/252 |
| 5,453,718 A | * | 9/1995 | Kurokawa et al. .......... 330/252 |
| 5,479,137 A | * | 12/1995 | Harford ....................... 330/252 |
| 5,729,176 A | | 3/1998 | Main et al. |
| 5,999,050 A | * | 12/1999 | Baltus ......................... 330/252 |
| 6,346,856 B1 | * | 2/2002 | Myers et al. ................ 330/252 |
| 6,351,195 B1 | * | 2/2002 | Atokawa et al. ............ 333/134 |

OTHER PUBLICATIONS

Jensen et al., "A 3.2 GHz Second Order Delta–Sigma Modulator Implemented in InP HBT Technology", IEEE Journal of Solid State Circuits, 30(10), Oct. 1995.

* cited by examiner

Primary Examiner—Michael Tokar
Assistant Examiner—Lam T. Mai
(74) Attorney, Agent, or Firm—Browdy and Neimark, P.L.L.C.

(57) ABSTRACT

A differential linear amplifier includes a main differential amplification circuit, coupled to receive a differential input signal at the input of the amplifier and to generate a differential output signal at the output of the amplifier. Odd- and even-order compensation circuits respectively sample odd- and even-order harmonic currents in the main differential amplification circuit and amplify the sampled currents so as to generate odd- and even-order compensation signals for subtraction from the differential output signal. A filter provides phase matching of second- and third-order harmonic components at a desired frequency at the output of the amplifier between the differential output signal and the even- and odd-order compensation signals.

17 Claims, 5 Drawing Sheets

AMPLIFIER WITH SUPPRESSION OF HARMONICS

CROSS-REFERENCE TO RELATED APPLICATION

This application claims the benefit of U.S. Provisional Patent Application No. 60/224,622, filed Aug. 11, 2000, which is incorporated herein by reference.

FIELD OF THE INVENTION

The present invention relates generally to amplifier circuits, and specifically to highly-linear amplifiers.

BACKGROUND OF THE INVENTION

The need for designing highly-linear amplifiers has become acute during the last decade because of the increasingly precise specifications associated with modern integrated circuits, e.g., wireless equipment and sensitive test equipment. In particular, the suppression of higher-order harmonic distortion in these circuits is desirable, and has been only partially addressed in the prior art through the use of differential circuitry, distortion compensation methods, and deep global feedback.

U.S. Pat. No. 4,267,516 to Traa, U.S. Pat. No. 5,729,176 to Main et al., U.S. Pat. No. 5,126,586 to Gilbert, U.S. Pat. No. 4,287,478 to Berger, U.S. Pat. No. 4,390,848 to Blauschild, and U.S. Pat. No. 4,390,848 to Robert, which are incorporated herein by reference, describe various circuit designs for suppressing odd-order harmonics. In an article by Jensen, et al., entitled, "A 3.2 GHz Second Order Delta-Sigma Modulator Implemented in InP HBT Technology," *IEEE Journal of Solid State Circuits,* 30(10), October, 1995, which is incorporated herein by reference, a technique for compensating for odd-order harmonics is described.

These circuits provided by the prior art, although improving linearity, leave several issues unresolved which prevent achieving the linearity required by state-of-the-art specifications. First, even if a circuit is theoretically designed to be symmetric, in practice there are always asymmetries, caused by variations in manufacturing processes, which result in the appearance of even-order harmonics in the output spectrum of a circuit. Second, in the existing designs of compensation circuits, the amplitude and phase balance at higher frequencies is violated, and the desired compensation is consequently not achieved.

Figure 1:
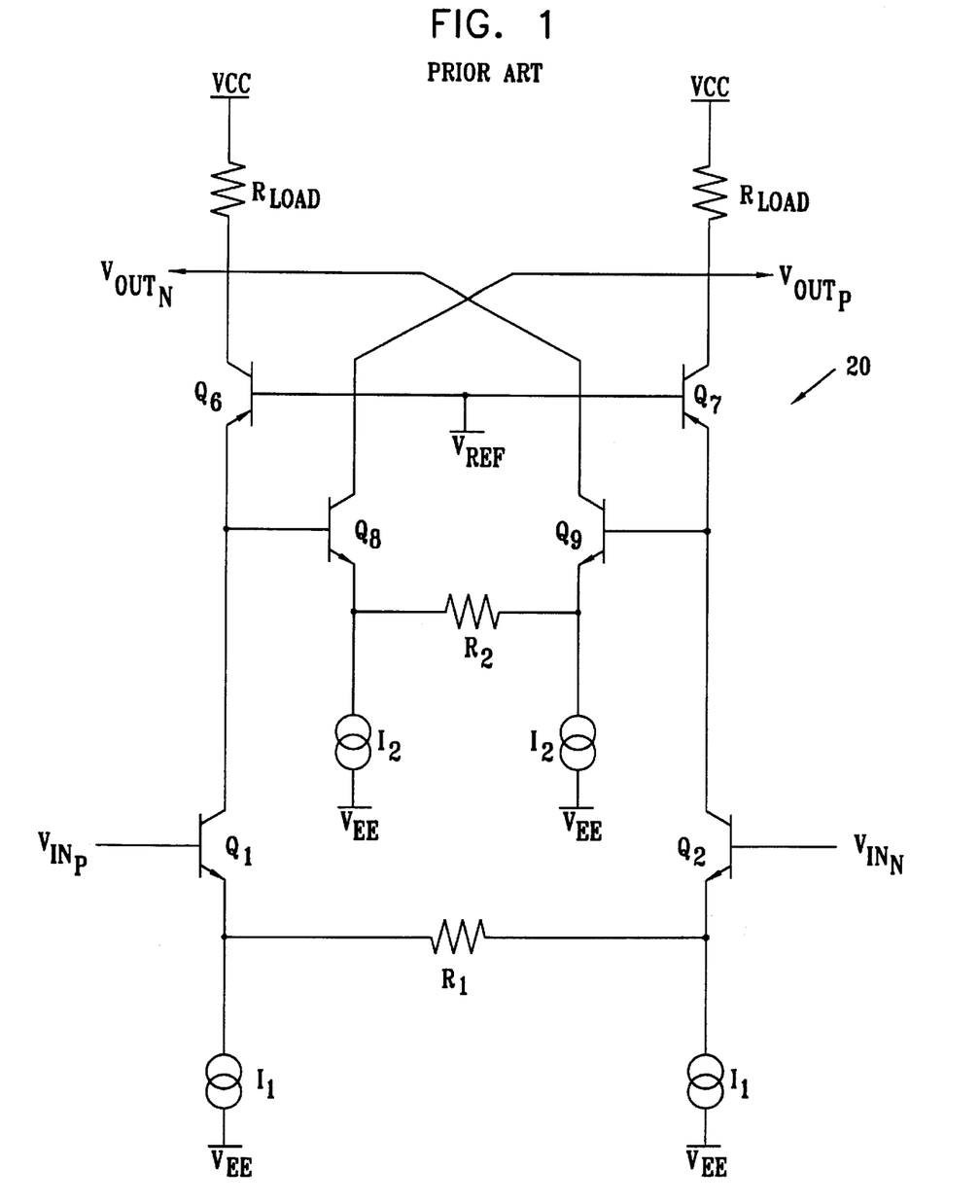
FIG. 1 is a schematic circuit diagram of a bipolar linear amplifier, as is known in the art.
Figure 2A:
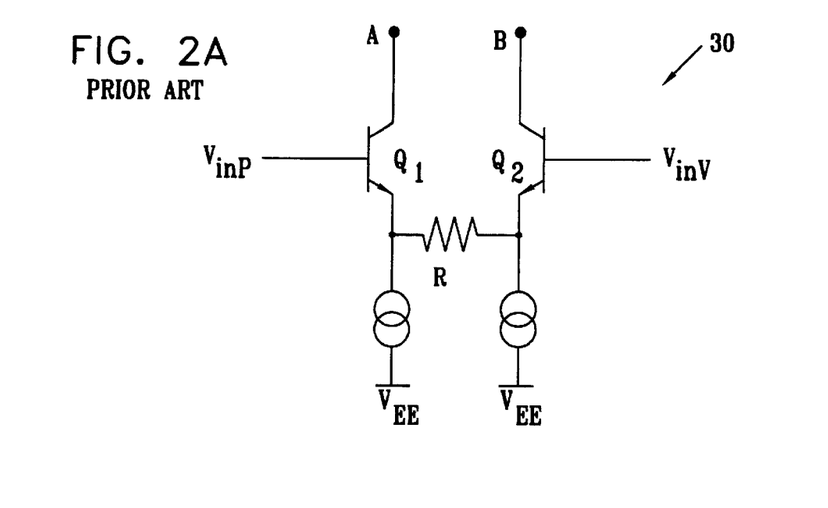
FIGS. 2A, 2B and 2C are schematic circuit diagrams showing details of the amplifier of FIG. 1.
Figure 2B:
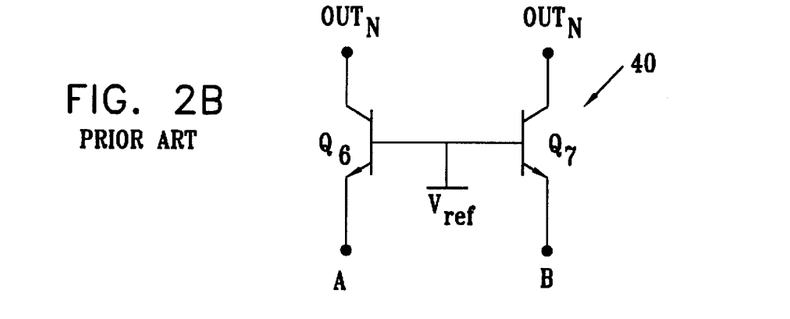
Figure 2C:
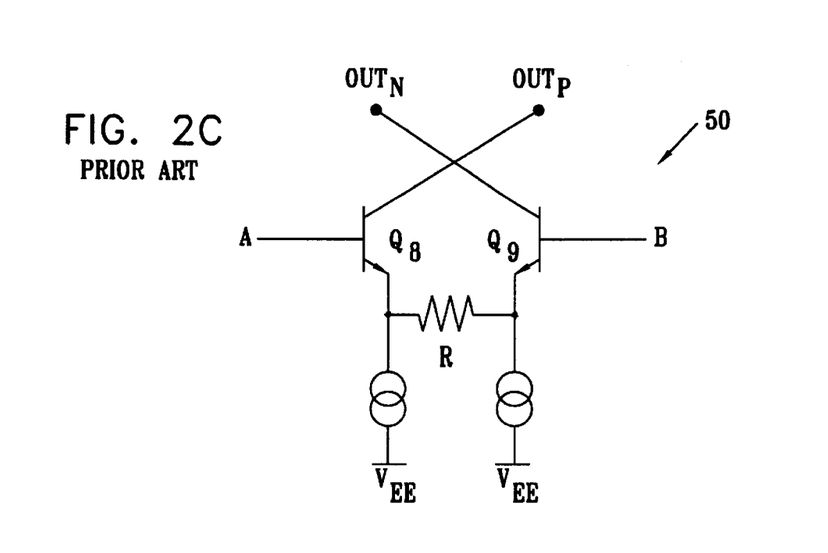

Reference is now made to FIGS. 1, 2A, 2B, and 2C. FIG. 1 is a schematic diagram of a prior art bipolar linear amplifier 20, as depicted in the above-cited article by Jensen. This amplifier includes three blocks: a differential pair block 30, a current-voltage block 40, and an odd-order harmonic correction block 50, shown respectively in FIGS. 2A, 2B, and 2C.

Block 30 (FIG. 2A) forms the basis of prior art amplifier 20. It includes transistors $Q_1$ and $Q_2$, and a resistor $R_1$, configured to form a first differential pair. The function of block 30 is to convert an input voltage signal $V_{IN}$ applied to the bases of the transistors into a nonlinear current I flowing through $Q_1$ and $Q_2$.

Block 40 (FIG. 2B) includes transistors $Q_6$ and $Q_7$ in a common base structure. The emitters of $Q_6$ and $Q_7$ are connected to the collectors of transistors $Q_1$ and $Q_2$, respectively. The function of block 40 is to convert the nonlinear collector currents of $Q_1$ and $Q_2$ into nonlinear voltages, which are applied as inputs to block 50, and to bypass the collector currents of $Q_6$ and $Q_7$ to the output of amplifier 20.

Block 50 (FIG. 2C) of prior art amplifier 20 is a compensation circuit for odd-order harmonics. Block 50 includes a second differential pair, consisting of transistors $Q_8$ and $Q_9$, and a resistor $R_2$. The bases of transistors $Q_8$ and $Q_9$ are respectively connected to the emitters of transistors $Q_6$ and $Q_7$, and the collectors of transistors $Q_8$ and $Q_9$ are cross-connected to the output of the amplifier. The purpose of block 50 is to convert voltages appearing at the bases of $Q_8$ and $Q_9$ into currents equal to the nonlinear parts of the collector currents of $Q_1$ and $Q_2$. The cancellation of odd-order harmonics is then achieved by cross-connecting of the collectors of $Q_8$ and $Q_9$ to the collectors of $Q_6$ and $Q_7$, as shown in FIG. 1. The structure of amplifier 20, however, does not provide cancellation of even-order harmonics.

SUMMARY OF THE INVENTION

Preferred embodiments of the present invention provide an improved amplifier circuit, preferably a bipolar linear amplifier, in which second- and third-order harmonics are simultaneously suppressed. The amplifier comprises a main gain unit and a harmonic compensation circuit that remains effective over a range of frequencies and which provides output linearity that generally has low sensitivity to variations in manufacturing processes of the circuit elements. As a result, the amplifier has increased linearity over wider bandwidth than comparable devices known in the art.

In preferred embodiments of the present invention, the linear amplifier comprises an odd order compensation circuit and an even order compensation circuit. These circuits are preferably optimized for the design frequency of the amplifier. Most preferably, the amplifier further comprises a linear phase matching filter, for increasing the effective bandwidth of the compensation circuits.

There is therefore provided, in accordance with a preferred embodiment of the present invention, a differential linear amplifier having an input and an output, including:

a main differential amplification circuit, coupled to receive a differential input signal at the input of the amplifier and to generate a differential output signal at the output of the amplifier;

an odd-order compensation circuit, coupled to sample an odd-order harmonic current in the main differential amplification circuit and to amplify the sampled odd-order harmonic current so as to generate an odd-order compensation signal for subtraction from the differential output signal; and an even-order compensation circuit, coupled to sample an even-order harmonic current in the main differential amplification circuit and to amplify the sampled even-order harmonic current so as to generate an even-order compensation signal for subtraction from the differential output signal.

In a preferred embodiment, the differential input signal includes an input voltage signal, and the main differential amplification circuit includes a transconductance cell, which is adapted to generate the differential output signal in the form of an output voltage or current signal.

Preferably, the main differential amplification circuit includes a differential pair of transistors mutually connected by a lattice of resistors, the lattice having first and second intermediate nodes, wherein the resistors are arranged to cancel the odd-order harmonic current at the first and second intermediate nodes, and wherein the even-order compensation circuit has first and second inputs that are respectively coupled to the first and second intermediate nodes so as to sample the even-order harmonic current. Most preferably, the even-order compensation circuit includes a pair of transistors, which are coupled respectively to the first and second differential inputs of the even-order compensation circuit, and which are mutually linked by a biasing circuit having a resistance chosen so that the even-order compensation signal cancels a second-order harmonic component in the differential output signal.

Preferably, the amplifier includes a filter, coupled to the output of the amplifier between the main differential amplification circuit and the odd-order compensation circuit, so as to provide phase matching of a third-order harmonic component at a desired frequency at the output of the amplifier between the differential output signal generated by the main differential amplification circuit and the odd-order compensation signal. Most preferably, the filter includes a second-order linear filter. Additionally or alternatively, the filter is further coupled between the main differential amplification circuit and the even-order compensation circuit, so as to provide phase matching of a second-order harmonic component at the desired frequency at the output of the amplifier between the differential output signal generated by the main differential amplification circuit and the even-order compensation signal.

There is also provided, in accordance with a preferred embodiment of the present invention, a differential linear amplifier having an input and an output, including:

a main differential amplification circuit, including:

a first differential pair of transistors arranged to amplify a differential input signal that is input to the amplifier so as to generate a differential output signal at the output of the amplifier, the transistors including respective bases that are coupled to receive the input signal and respective collectors and respective emitters;

at least one first resistor, having an effective resistance $R_1$, connected between the emitters; and a second differential pair of transistors coupled together in a common-base structure and including emitters coupled respectively to the collectors of the transistors in the first differential pair and collectors coupled to the output of the amplifier; and an odd-order compensation circuit, including:

a third differential pair of transistors including respective bases that are coupled respectively to the collectors of the first differential pair of transistors and respective collectors that are coupled to the output of the amplifier so as to generate a harmonic compensation signal at the output of the amplifier, and further including respective emitters; and at least one second resistor, having an effective resistance $R_2$, connected between the emitters of the third differential pair of transistors, wherein the resistances R1 and R2 are given substantially by:

$$r_1(r_2, m) = 2 \cdot \frac{m \cdot (1 + 0.5 \cdot r_2)^4 + (1-m)}{(1-m) \cdot [(1 + 0.5 \cdot r_2)^3 - 1]},$$

wherein $$r_i = R_i \cdot I_i \cdot \frac{q}{k \cdot T},$$

for an index $$i = 1, 2, \frac{I_1}{I_2} = \frac{m}{1-m}$$

m a parameter such that 0<m<1, $I_1$ is a DC bias current of the transistors in the first differential pair, $I_2$ is a DC bias current of the transistors in the third differential pair, q is a unit of elementary charge, k is Boltzmann's constant, and T is an operating temperature of the transistors.

Preferably, the amplifier includes a filter, coupled to the output of the amplifier between the main differential amplification circuit and the odd-order compensation circuit, so as to provide phase matching of a third-order harmonic component at a desired frequency at the output of the amplifier between the differential output signal generated by the main differential amplification circuit and the odd-order compensation signal.

There is additionally provided, in accordance with a preferred embodiment of the present invention, a method for linearizing an amplifier, including:

coupling a main differential amplification circuit to receive a differential input signal at an input of the amplifier and to generate a differential output signal at an output of the amplifier;

sampling an odd-order harmonic current in the main differential amplification circuit amplifying and phase-matching the sampled odd-order harmonic current in an odd-order compensation circuit so as to generate an odd-order compensation signal sampling an even-order harmonic current in the main differential amplification circuit;

amplifying and phase-matching the sampled even-order harmonic current in an even-order compensation circuit so as to generate an even-order compensation signal; and subtracting the phase-matched odd-order and even-order compensation signals from the differential output signal.

There is further provided, in accordance with a preferred embodiment of the present invention, a method for linearizing a differential amplifier having an input and an output, including:

providing a main differential amplification circuit, including:

a first differential pair of transistors arranged to amplify a differential input signal that is input to the amplifier so as to generate a differential output signal at the output of the amplifier, the transistors including respective bases that are coupled to receive the input signal and respective collectors and emitters;

at least one first resistor, having an effective resistance $R_1$, connected between the emitters; and a second differential pair of transistors coupled together in a common-base structure and including emitters coupled respectively to the collectors of the transistors in the first differential pair and collectors coupled to the output of the amplifier;

providing an odd-order compensation circuit, including:

a third differential pair of transistors including respective bases that are coupled respectively to the collectors of the first differential pair of transistors and respective collectors that are coupled to the output of the amplifier so as to generate a harmonic compensation signal at the output of the amplifier, and further including respective emitters; and at least one second resistor, having an effective resistance $R_2$, connected between the emitters of the third differential pair of transistors; and setting the resistances R1 and R2 so that the resistances are given substantially by:

$$r_1(r_2, m) = 2 \cdot \frac{m \cdot (1 + 0.5 \cdot r_2)^4 + (1-m)}{(1-m) \cdot [(1 + 0.5 \cdot r_2)^3 - 1]},$$

wherein $$r_i = R_i \cdot I_i \cdot \frac{q}{k \cdot T},$$

for an index $$i = 1, 2, \frac{I_1}{I_2} = \frac{m}{1-m}$$

m, a parameter such that 0<m<1, $I_1$ is a DC bias current of the transistors in the first differential pair, $I_2$ is a DC bias current of the transistors in the third differential pair, q is a unit of elementary charge, k is Boltzmann's constant, and T is an operating temperature of the transistors.

The present invention will be more fully understood from the following detailed description of the preferred embodiments thereof, taken together with the drawings, in which:

DETAILED DESCRIPTION OF PREFERRED EMBODIMENTS

Figure 3:
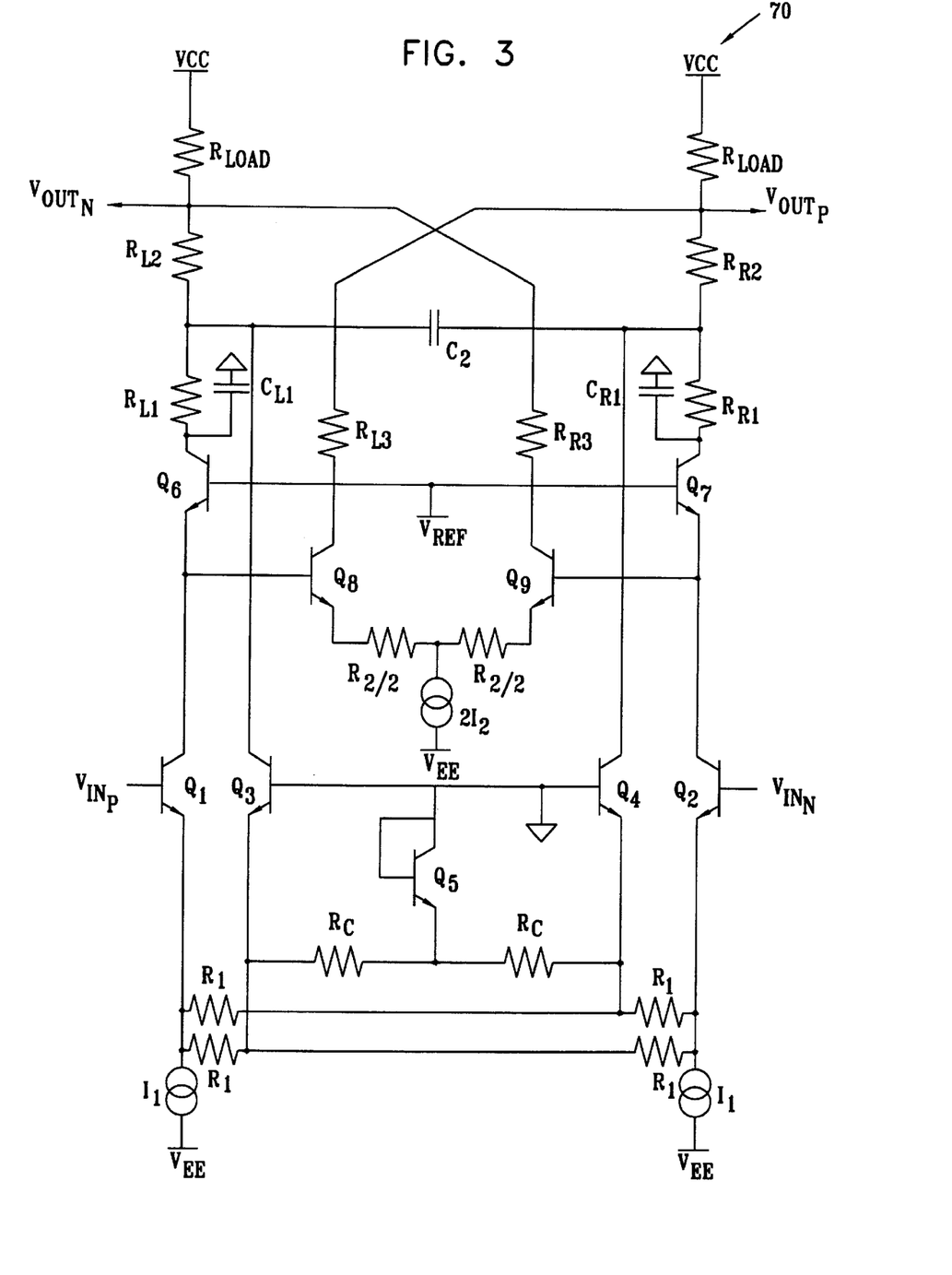
FIG. 3 is a schematic circuit diagram of a bipolar linear amplifier, in accordance with a preferred embodiment of the present invention.

Reference is now made to FIGS. 3, 4A, 4B, 4C, 4D, and 4E. FIG. 3 is a schematic diagram of a bipolar linear amplifier 70, in accordance with an embodiment of the present invention. FIGS. 4A, 4B, 4C, 4D, and 4E are schematic diagrams of five logical blocks that make up amplifier 70: a differential pair block 80, a current-voltage conversion block 90, an odd-order harmonic compensation block 100, an even-order compensation block 110, and a linear matching phase filter block 120 in amplifier 70. Amplifier 70 is broken up into the blocks of FIGS. 4A–4E to aid in understanding the operation of the amplifier. Typically, all of these blocks are fabricated together in a single integrated circuit.

Block 80 (FIG. 4A) is a transconductance cell, similar to block 30 in prior art amplifier 20. Block 80 comprises transistors $Q_1$ and $Q_2$ and a bridge of four resistors $R_1$, which preferably have identical resistance. These four resistors can be represented by an equivalent resistor $R_{1eqv}=(R_1+R_1)$ ||$(R_1+R_1)$, which forms a differential pair in combination with $Q_1$ and $Q_2$. The purpose of block 80 is to convert an input voltage signal $V_{in(P)}-V_{in(N)}$ that is applied across the transistors' bases into a nonlinear current flowing through $Q_1$ and $Q_2$. The emitter degeneration resistor $R_{1eqv}$ determines the gain and nonlinearity of the transconductance cell.

Block 90 (FIG. 4B) is a common-base structure formed by $Q_6$ and $Q_7$, similar to block 40 in prior art amplifier 20. The emitters of transistors $Q_6$ and $Q_7$ are connected to the collectors of transistors $Q_1$ and $Q_2$. The functions of block 90 are: (a) to convert the collector currents of $Q_1$ and $Q_2$ into a nonlinear voltage, which is applied as an input to block 100, and (b) to bypass the collector currents of $Q_6$ and $Q_7$ to the output of block 90, which serves as one of the inputs to block 120.

Block 100 (FIG. 4C) is a second differential pair, similar to block 50 in prior art amplifier 20. Block 100 comprises transistors $Q_8$ and $Q_9$, with two degeneration resistors having values $R_2/2$ connecting their emitters, as shown. The bases of $Q_8$ and $Q_9$ are connected to the emitters of $Q_6$ and $Q_7$, and the collectors are connected through $R_{L3}$ and $R_{R3}$ to the output of amplifier 20. The main function of block 100 is to generate odd-order harmonic correction currents from the nonlinear voltage supplied by block 90.

Block 110 (FIG. 4D) comprises (a) transistors $Q_3$ and $Q_4$, which form a differential pair with grounded bases, and (b) a biasing/tuning circuit which includes a transistor $Q_5$ and two resistors $R_C$. The purpose of block 110 is to prevent even-order harmonics from appearing the output current. Block 110 receives its input (i.e., the emitter voltages of $Q_3$ and $Q_4$) from the resistor lattice in block 80. The collector currents of $Q_3$ and $Q_4$ are connected to a linear phase matching filter in block 120 (FIG. 4E), described hereinbelow. Transistor $Q_5$ preferably has its base and collector connected, so that the transistor effectively operates as a diode. It is used together with resistors $R_C$ for fine-tuning of the $Q_3$ and $Q_4$ collector currents.

Figure 4A:
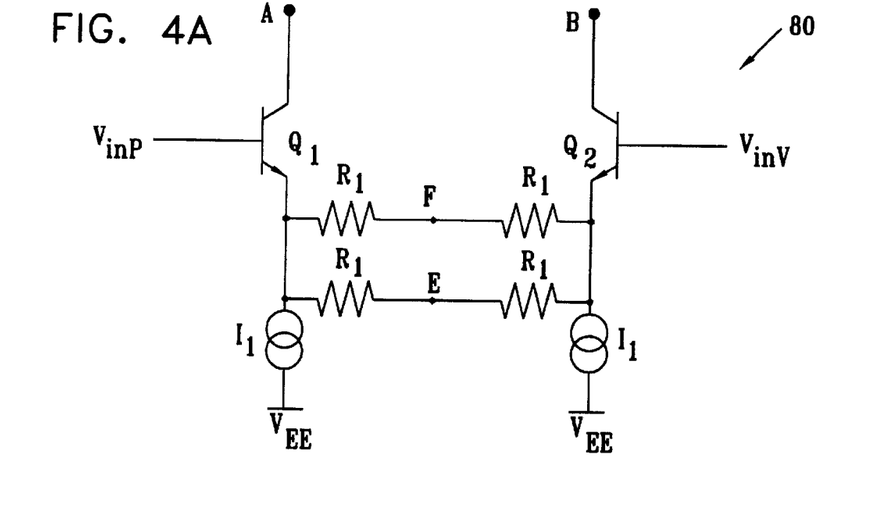
FIGS. 4A, 4B, 4C, 4D, and 4E are schematic circuit diagrams showing details of the bipolar linear amplifier shown in FIG. 3.
Figure 4B:
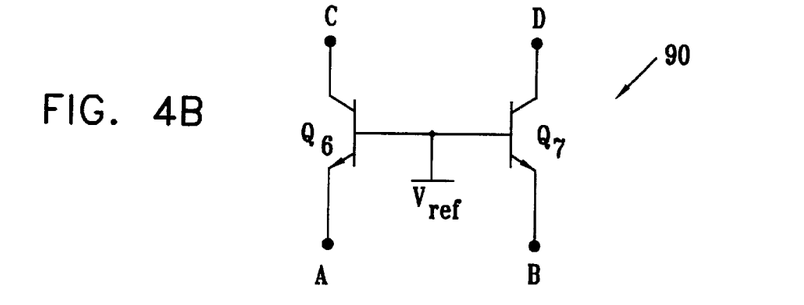
Figure 4C:
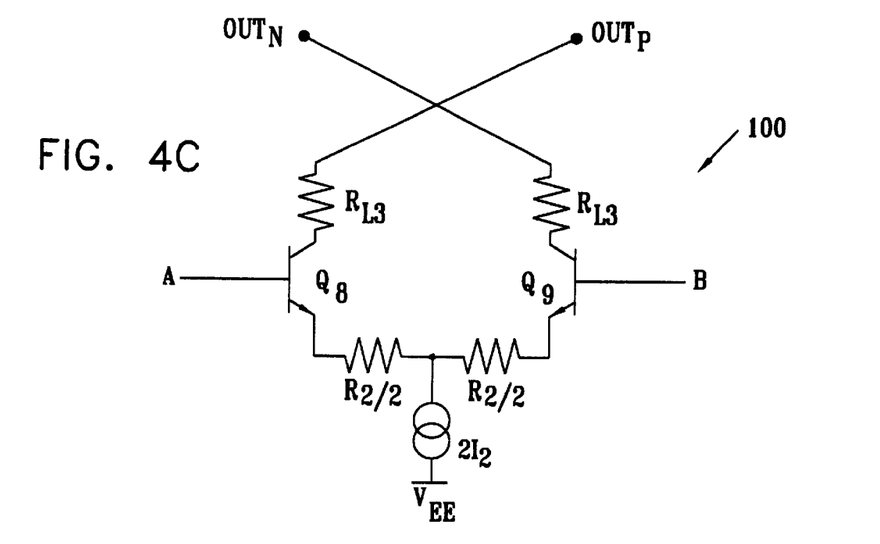
Figure 4D:
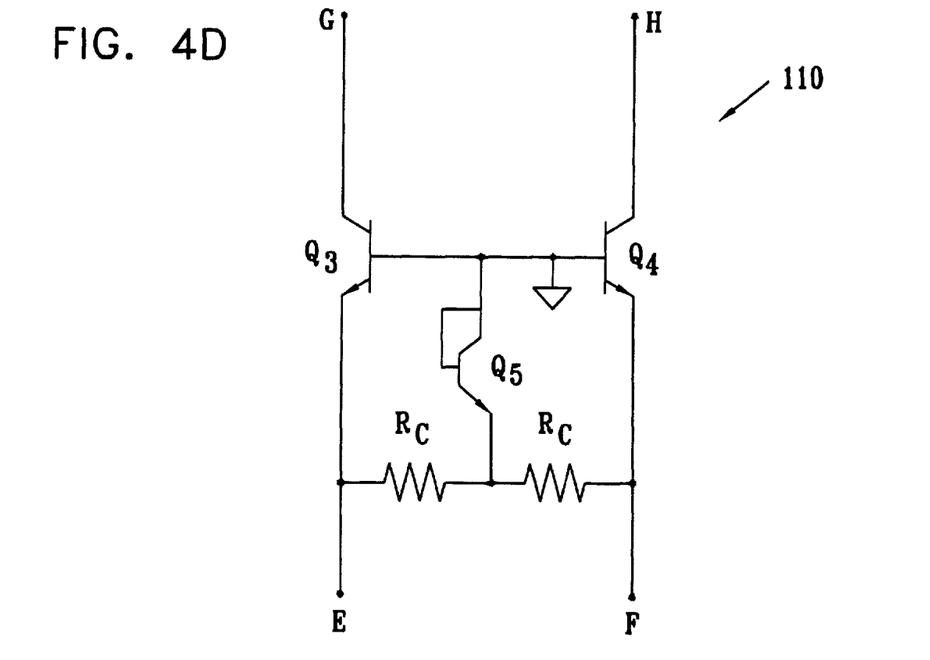
Figure 4E:
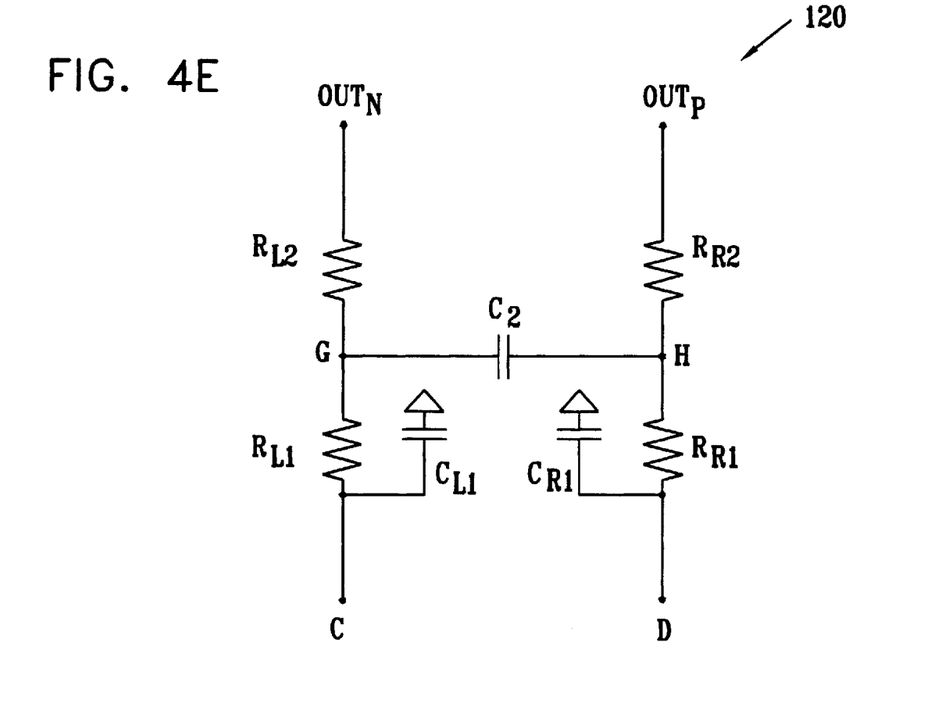

The purpose of block 120 is to match between the phases of the odd-order harmonics (mainly third-order) of the compensating current generated by block 100, the second-order harmonic of the compensating current generated by block 110, and their respective counterparts in the main current at the collectors of $Q_6$ and $Q_7$. This function is achieved by two linear filters of first and second order, combined into one circuit. The first-order filters include the circuit elements $R_{L1}$ and $C_{L1}$, and $R_{L2}$ and $C_{L2}$, respectively. The current from the collectors of $Q_6$ and $Q_7$ is fed into the filter. Then the delayed currents are combined with those from the collectors of $Q_3$ and $Q_4$. The second-order filter is made by serial connection of the above-mentioned first-order filter with an additional first-order filter ($R_{L2}$, $C_2$, and $R_{R2}$). The current from the collectors of $Q_6$ and $Q_7$ passes through both filter stages and is then combined with the compensation current for the third-order harmonic. The component values in block 120 are preferably chosen so as to provide accurate phase matching between the high-order harmonics of the primary signal from block 90 and the compensation currents from blocks 100 and 110 over a desired bandwidth for high-precision compensation.

Preferably, bipolar linear amplifier circuit 70 includes two DC bias current sources $I_1$ and $I_2$ implemented with transistors, as is known in the art, and three DC voltage supplies, $V_{EE}$, $V_{CC}$ and $V_{REF}$, as shown in the figure.

Amplifier 70, preferably operates in the following way:

An input voltage signal $\pm V_{IN}$ is converted into non-linear currents by transistors $Q_1$ and $Q_2'$ in block 80. The complex non-linearity of these currents depends on the parameters of these transistors and on the feedback resistor $R_1$. Even and odd harmonics in these currents are treated separately.

Even harmonics are separated from their odd counterparts by current addition in the $R_{1eqv}$ resistor lattice, and then are transferred through $Q_3$, $Q_4$ (block 110) to be combined with the outputs of the first-order phase correction filter in block 120. The magnitude of the transferred even order harmonics depends on the value of $R_C$. The first-order filter tunes the phase of the current from the collectors of $Q_6$ and $Q_7$. The amount of tuning depends on the time constants $R_{L1}*C_{L1}$ and $R_{R1}*C_{R1}$. This structure provides an effective compensation of the even order harmonics generated in block 80 and block 90.

The odd order harmonics of the output currents of block 80 are translated into voltages in block 90 and then are fed to the inputs (bases of $Q_8$, $Q_9$) of block 100. On account of the operation of block 110, the output currents of block 100 do not include fundamental and higher-order even harmonics. These outputs are used for the compensation of the odd harmonics in the currents output by block 90. In order to obtain an efficient compensation, both magnitudes and phases of the output currents of block 90 and block 100 should be matched.

In order to calculate the condition for the magnitude balance of the currents, we start with a simplified Ebbers-Moll model of a bipolar transistor:

$$I_E = I_C = I_S \cdot e^{(V_{BE} \cdot \frac{q}{k \cdot T})}$$

In this equation, $I_C$ is the collector current, $I_E$ is the emitter current, $I_S$ is the emitter saturation current, $V_{BE}$ is the base-emitter voltage drop, q is the elementary charge, k is the Boltzmann constant, and T is the He absolute operating temperature. This current model is inserted into the Taylor expansion of the Kirchhoff voltage laws for blocks 80, 90 and 100. It can then be shown that in order to cancel out the third-order harmonic from the output current spectrum, for frequencies that are sufficiently low so that the impedances involved in the calculation can be represented by their real parts only, $R_1$ and $R_2$ must be chosen according to the following equation:

$$r_1(r_2, m) = 2 \cdot \frac{m \cdot (1 + 0.5 \cdot r_2)^4 + (1 - m)}{(1 - m) \cdot [(1 + 0.5 \cdot r_2)^3 - 1]} \quad (1)$$

In this equation, $$r_i = R_i \cdot I_i \cdot \frac{q}{k \cdot T},$$

for i=1,2, and the bias currents $I_1$ and $I_2$ are given by $$\frac{I_1}{I_2} = \frac{m}{1 - m} \quad 0 < m < 1.$$

On the other hand, $R_1$ and $R_2$ control the gain of the transconductance cell defined by blocks 80, 90 and 100. The dependence is given by:

$$G_M(m, r_1, r_2) = \frac{2}{2 + r_1(r_2, m)}\left(m + \frac{1 - m}{2 + r_2}\right) \quad (2)$$

wherein $r_1(r_2, m)$ is defined by equation (1).

The gain $G_M$ reaches its maximum when the value of $r_2$ is near 1, and it decreases when $R_1$ and $R_2$ become larger. On the other hand, larger values of $R_1$ and $R_2$ reduce the temperature dependence of the degree of compensation. The choice of the values of $R_1$ and $R_2$ from the solution space of equation (1) depends on other requirements from the circuit, its environment and other factors. Equations (1) and (2) can be used to systematically select the appropriate values for $R_1$ and $R_2$ not only in amplifier 70, but also in transconductance amplifiers known in the art, such as amplifier 20 (FIG. 1). The prior art does not provide a systematic, quantitative method for setting these resistances.

Efficient compensation of odd harmonics requires both magnitude and phase balance between the outputs of block 90 and block 100. Because of the complex nature of the impedances involved in the calculation, at high frequencies the amplitude and phase balance of the compensating currents is violated. As a result, the effectiveness of the compensation degrades with higher frequencies. To solve this problem, amplifier 70 includes a linear filter in block 120, which preserves the desired balance and thus extends the effective compensation bandwidth.

As evident from FIG. 3, the propagation delay of the compensation signal toward the output (from the $Q_{1(2)}$ base to the $Q_{9(8)}$ collector) is longer than that of the primary signal (from the $Q_{1(2)}$ base to the $Q_{6(7)}$ collector). At high frequencies the difference in these delays cannot be neglected. Therefore, phase shifts are preferably inserted into the path of the primary signal by means of $R_{L1}$, $C_{L1}$, $R_{L2}$, $R_{R1}$, $C_{R1}$, $R_{R2}$ and $C_2$, which are arranged to provide a second order linear filter. (Typically the corresponding left- and right-side values of the paired components, such as $R_{L1}$ and $R_{R1}$, are the same.) Using this filter allows both amplitude and phase balance of the third order harmonic compensating currents to be maintained simultaneously. The component values are preferably chosen so as to tune the filter to a specific frequency around which amplifier 70 is to have maximum linear performance.

In order not to be limited in performance by even harmonics due to asymmetry of the differential circuitry, these harmonics are reduced separately in each single-ended side of the circuitry. Transistors $Q_3$ and $Q_4$ in block 110 sample the common mode voltage and convert it into the even-order harmonic current with opposite phase to that of transistors $Q_1$ and $Q_2$. Transistor $Q_5$ and the two resistors $R_C$ act as a second-order harmonic magnitude attenuator. For efficient second-order harmonic suppression at high frequencies, a linear filter is preferably used as for the third harmonic compensation. Preferably, the filters of block 120 are also used to preserve the phase balance of the second-order harmonic compensating currents.

Although amplifier 70, as shown and discussed above, is of bipolar design, the principles of the present invention may similarly be applied to create highly-linear, wideband amplifiers based on other technologies, including CMOS, NMOS and BiCMOS. Such amplifiers may be implemented in various semiconductor materials, including Si, SiGe, GaAs, as well such other technologies and materials as may be known in the art. Amplifiers of this sort can be used in a wide range of applications, such as GmC filters, integrated delta-sigma modulators, and input stages of operational amplifiers, for example. Although amplifier 70 is of the transconductance type, the principles of harmonic cancellation embodied in the amplifier may likewise be used in differential amplifiers of other types, such as low-noise amplifiers and power amplifiers used in radio frequency applications, for example.

It will thus be appreciated by persons skilled in the art that the present invention is not limited to what has been particularly shown and described hereinabove. Rather, the scope of the present invention includes both combinations and subcombinations of the various features described hereinabove, as well as variations and modifications thereof that are not in the prior art, which would occur to persons skilled in the art upon reading the foregoing description.

What is claimed is:

1. A differential linear amplifier having an input and an output, comprising:
   a main differential amplification circuit, coupled to receive a differential input signal at the input of the amplifier and to generate a differential output signal at the output of the amplifier;
   an odd-order compensation circuit, coupled to sample an odd-order harmonic current in the main differential amplification circuit and to amplify the sampled odd-order harmonic current so as to generate an odd-order compensation signal for subtraction from the differential output signal; and
   an even-order compensation circuit, coupled to sample an even-order harmonic current in the main differential amplification circuit and to amplify the sampled even-order harmonic current so as to generate an even-order compensation signal for subtraction from the differential output signal.

2. An amplifier according to claim 1, wherein the differential input signal comprises an input voltage signal, and wherein the main differential amplification circuit comprises a transconductance cell, which is adapted to generate the differential output signal.

3. An amplifier according to claim 1, wherein the main differential amplification circuit comprises a differential pair of transistors, which comprise respective emitters mutually connected by a lattice of resistors having first and second intermediate nodes, wherein the even-order compensation circuit has first and second inputs that are respectively coupled to the first and second intermediate nodes of the lattice so as to sample the even-order harmonic current.

4. An amplifier according to claim 3, wherein the even-order compensation circuit comprises a further pair of transistors, which are coupled respectively to the first and second inputs of the even-order compensation circuit, and which are mutually linked by a linking circuit having a resistance chosen so that the even-order compensation signal cancels a second-order harmonic component in the output signal.

5. An amplifier according to claim 1, and comprising a filter, coupled to the output of the amplifier between the main differential amplification circuit and the odd-order compensation circuit, so as to provide phase matching of a third-order harmonic component at a desired frequency at the output of the amplifier between the differential output signal generated by the main differential amplification circuit and the odd-order compensation signal.

6. An amplifier according to claim 5, wherein the filter comprises a second-order linear filter.

7. An amplifier according to claim 5, wherein the filter is further coupled between the main differential amplification circuit and the even-order compensation circuit, so as to provide phase matching of a second-order harmonic component at the desired frequency at the output of the amplifier between the differential output signal generated by the main differential amplification circuit and the even-order compensation signal.

8. A differential linear amplifier having an input and an output, comprising:
   a main differential amplification circuit, comprising:
      a first differential pair of transistors arranged to amplify a differential input signal that is input to the amplifier so as to generate a differential output signal at the output of the amplifier, the transistors comprising respective bases that are coupled to receive the input signal and respective collectors and respective emitters;
      at least one first resistor, having an effective resistance $R_1$, connected between the emitters; and
      a second differential pair of transistors coupled together in a common-base structure and including emitters coupled respectively to the collectors of the transistors in the first differential pair and collectors coupled to the output of the amplifier; and
   an odd-order compensation circuit, comprising:
      a third differential pair of transistors comprising respective bases that are coupled respectively to the collectors of the first differential pair of transistors and respective collectors that are coupled to the output of the amplifier so as to generate a harmonic compensation signal at the output of the amplifier, and further comprising respective emitters; and
      at least one second resistor, having an effective resistance $R_2$, connected between the emitters of the third differential pair of transistors,
   wherein the resistances R1 and R2 are given substantially by:

$$r_1(r_2, m) = 2 \cdot \frac{m \cdot (1 + 0.5 \cdot r_2)^4 + (1-m)}{(1-m) \cdot [(1 + 0.5 \cdot r_2)^3 - 1]},$$

wherein $$r_i = R_i \cdot I_i \cdot \frac{q}{k \cdot T},$$

for an index $$i = 1, 2, \frac{I_1}{I_2} = \frac{m}{1-m}$$

m a parameter such that 0<m<1, $I_1$ is a DC bias current of the transistors in the first differential pair, $I_2$ is a DC bias current of the transistors in the second differential pair, q is a unit of elementary charge, k is Boltzmann's constant, and T is an operating temperature of the transistors.

9. An amplifier according to claim 8, and comprising a filter, coupled to the output of the amplifier between the main differential amplification circuit and the odd-order compensation circuit, so as to provide phase matching of a third-order harmonic component at a desired frequency at the output of the amplifier between the differential output signal generated by the main differential amplification circuit and the odd-order compensation signal.

10. A method for linearizing an amplifier, comprising:
   coupling a main differential amplification circuit to receive a differential input signal at an input of the amplifier and to generate a differential output signal at an output of the amplifier;

sampling an odd-order harmonic current in the main differential amplification circuit;

amplifying the sampled odd-order harmonic current in an odd-order compensation circuit so as to generate an odd-order compensation signal;

sampling an even-order harmonic current in the main differential amplification circuit;

amplifying the sampled even-order harmonic current in an even-order compensation circuit so as to generate an even-order compensation signal; and subtracting the odd-order and even-order compensation signals from the differential output signal.

11. A method according to claim 10, wherein the differential input signal comprises an input voltage signal, and wherein the main differential amplification circuit comprises a transconductance cell, which is adapted to generate the differential output signal.

12. A method according to claim 10, wherein the main differential amplification circuit comprises a pair of transistors mutually connected by a lattice of resistors, the lattice having first and second intermediate nodes, wherein the resistors are arranged to cancel the odd-order harmonic current at the first and second intermediate nodes, and wherein sampling the even-order harmonic current comprises sampling the current at the first and second intermediate nodes.

13. A method according to claim 12, wherein the even-order compensation circuit comprises a differential pair of transistors, which are coupled respectively to the first and second differential inputs of the even-order compensation circuit, and which are mutually linked by a linking circuit having a resistance chosen so that the even-order compensation signal cancels a second-order harmonic component in the differential output signal.

14. A method according to claim 10, and comprising filtering an output of the main differential amplification circuit and the odd-order compensation signal, so as to provide phase matching of a third-order harmonic component at a desired frequency at the output of the amplifier between the differential output signal generated by the main differential amplification circuit and the odd-order compensation signal.

15. A method according to claim 14, and comprising filtering the even-order compensation signal, so as to provide phase matching of a second-order harmonic component at the desired frequency at each end of the output of the amplifier between the differential output signal generated by the main differential amplification circuit and the even-order compensation signal.

16. A method for linearizing a differential amplifier having an input and an output, comprising:

providing a main differential amplification circuit, comprising:

a first differential pair of transistors arranged to amplify a differential input signal that is input to the amplifier so as to generate a differential output signal at the output of the amplifier, the transistors comprising respective bases that are coupled to receive the input signal and respective collectors and emitters;

at least one first resistor, having an effective resistance $R_1$, connected between the emitters; and a second differential pair of transistors coupled together in a common-base structure and including emitters coupled respectively to the collectors of the transistors in the first differential pair and collectors coupled to the output of the amplifier; and providing an odd-order compensation circuit, comprising:

a third differential pair of transistors comprising respective bases that are coupled respectively to the collectors of the first differential pair of transistors and respective collectors that are coupled to the output of the amplifier so as to generate a harmonic compensation signal at the output of the amplifier, and further comprising respective emitters; and at least one second resistor, having an effective resistance $R_2$, connected between the emitters of the third differential pair of transistors; and setting the resistances R1 and R2 so that the resistances are given substantially by:

$$r_1(r_2, m) = 2 \cdot \frac{m \cdot (1 + 0.5 \cdot r_2)^4 + (1 - m)}{(1 - m) \cdot [(1 + 0.5 \cdot r_2)^3 - 1]},$$

wherein $$r_i = R_i \cdot I_i \cdot \frac{q}{k \cdot T},$$

for an index $$i = 1, 2, \frac{I_1}{I_2} = \frac{m}{1 - m}$$

m a parameter such that 0<m<1, $I_1$ is a DC bias current of the transistors in the first differential pair, $I_2$ is a DC bias current of the transistors in the third differential pair, q is a unit of elementary charge, k is Boltzmann's constant, and T is an operating temperature of the transistors.

17. A method according to claim 16, and comprising filtering an output of the main differential amplification circuit and the odd-order compensation signal, so as to provide phase matching of a third-order harmonic component at a desired frequency at the output of the amplifier between the differential output signal generated by the main differential amplification circuit and the odd-order compensation signal.

* * * * *